United States Patent
Onishi (10) Patent No.: US 10,056,915 B2
(45) Date of Patent: Aug. 21, 2018

(54) DIGITAL-TO-ANALOG CONVERTER

(71) Applicant: SEMICONDUCTOR COMPONENTS INDUSTRIES, LLC, Phoenix, AZ (US)

(72) Inventor: Akinobu Onishi, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/937,175

(22) Filed: Nov. 10, 2015

(65) Prior Publication Data

US 2017/0019122 A1     Jan. 19, 2017

Related U.S. Application Data (60) Provisional application No. 62/193,467, filed on Jul. 16, 2015.

(51) Int. Cl.
*H04B 15/00*     (2006.01)
*H03M 1/66*     (2006.01)
(Continued)

(52) U.S. Cl.
CPC ............ *H03M 1/661* (2013.01); *H03F 3/187* (2013.01); *H03F 3/45475* (2013.01);
(Continued)

(58) Field of Classification Search
CPC ...... H03M 1/12; H03M 1/468; H03M 1/1245; H03M 1/66; H03M 1/08; H03M 1/00;
(Continued)

(56) References Cited

U.S. PATENT DOCUMENTS 5,436,872 A * 7/1995 Gilmour .............. G10K 11/341
    367/103
5,880,689 A * 3/1999 Kushner ................... G06J 1/00
    341/118

(Continued)

FOREIGN PATENT DOCUMENTS

EP     0967726     * 12/1999
EP     0967726 A1     12/1999
(Continued)

*Primary Examiner* — Norman Yu (74) *Attorney, Agent, or Firm* — Polansky & Associates, P.L.L.C.; Paul J. Polansky (57) ABSTRACT

A digital-to-analog converter (DAC) circuit includes a first DAC that produces a first analog output signal based upon a received multi-bit digital signal and upon a received clock. A second DAC that produces a second analog output signal based upon the received multi-bit digital signal and upon the received clock, wherein the first and second DACs are connected in parallel and process the same multi-bit digital signal. In one embodiment, the DACs produce differential signals. A low pass filter connected to receive the first and second analog outputs is configured to sum the first and second analog outputs and to filter the summed first and second analog outputs to produce an ingoing analog signal. An amplifier is connected to receive the ingoing analog signal to produce an amplified ingoing analog signal.

19 Claims, 11 Drawing Sheets

(51) Int. Cl.
*H03M 1/00* (2006.01)
*H03M 3/00* (2006.01)
*H03M 1/70* (2006.01)
*H03M 1/06* (2006.01)
*H04R 3/00* (2006.01)
*H03F 3/45* (2006.01)
*H03F 3/187* (2006.01)

(52) U.S. Cl.
CPC ......... *H03M 1/002* (2013.01); *H03M 1/0626* (2013.01); *H03M 1/70* (2013.01); *H03M 3/32* (2013.01); *H03M 3/344* (2013.01); *H03M 3/508* (2013.01); *H03M 3/51* (2013.01); *H04R 3/00* (2013.01); *H03F 2200/03* (2013.01); *H03F 2203/45526* (2013.01)

(58) Field of Classification Search
CPC ........ H03M 1/001; H03M 1/123; H03M 1/36; H03M 1/005; H03M 1/1071; H03M 1/442; H03M 1/1009; H03M 1/1047; H03M 1/122; H03M 1/124; H03M 1/203; H03M 1/403; H03M 3/30; H03M 3/50; H03M 1/661; H03M 1/002; H03M 1/0626; H03M 1/70; H03M 3/32; H03M 3/344; H03M 3/508; H03M 3/51; H04N 5/357; H03F 3/187; H03F 3/45475; H03F 2200/03; H03F 2203/45526; H04R 3/00
USPC ........................ 341/144, 159, 120, 131, 143; 381/120–121, 94.1–94.4, 98
See application file for complete search history.

(56) References Cited

U.S. PATENT DOCUMENTS

| | | | | |
|---|---|---|---|---|
| 5,977,896 | A | 11/1999 | Kohdaka et al. | |
| 6,369,645 | B1* | 4/2002 | Takahashi | H03H 11/126 |
| | | | | 327/552 |
| 6,462,690 | B1* | 10/2002 | Gaboriau | H03M 3/502 |
| | | | | 341/143 |
| 6,509,857 | B1* | 1/2003 | Nakao | H03M 1/682 |
| | | | | 341/121 |
| 8,515,093 | B2* | 8/2013 | Bhandari | H04R 3/005 |
| | | | | 381/102 |
| 2004/0251857 | A1* | 12/2004 | Ryu | H04N 9/28 |
| | | | | 315/364 |
| 2005/0052301 | A1* | 3/2005 | Mills | H03M 1/0643 |
| | | | | 341/144 |
| 2008/0062022 | A1* | 3/2008 | Melanson | H03M 3/464 |
| | | | | 341/143 |
| 2014/0368703 | A1* | 12/2014 | Yao | H04N 5/378 |
| | | | | 348/295 |
| 2016/0118996 | A1* | 4/2016 | Chen | H03M 1/66 |
| | | | | 341/118 |

FOREIGN PATENT DOCUMENTS

| | | |
|---|---|---|
| JP | H04-81130 A | 3/1992 |
| JP | H05-67976 A | 3/1993 |
| JP | 2000-82960 A | 3/2000 |
| JP | 2001-127638 A | 5/2001 |

\* cited by examiner

FIG. 12

DIGITAL-TO-ANALOG CONVERTER

CROSS REFERENCE TO RELATED APPLICATIONS

This application claims priority to U.S. Provisional Application No. 62/193,467, filed on Jul. 16, 2015, entitled "DIGITAL-TO-ANALOG CONVERTER," invented by Akinobu Onishi.

FIELD OF THE DISCLOSURE

The present disclosure relates generally to mixed signal circuits and, more particularly, to digital-to-analog converter circuits.

BACKGROUND

Circuit designers, as a general goal, tend to prefer designs that improve signal-to-noise ratios for audio circuits, radios, wired communication devices, data transmission systems, etc. Generally, two basic approaches for improving signal-to-noise ratios include utilizing communication pathways that are less lossy or have lower noise or, alternatively, by increasing the gain of a gain stage. In some wireless communication systems, such as code division multiple access systems, however, there is a constant feedback processing system to minimize signal power levels while maintaining certain signal-to-noise ratios to reduce the possibility of interfering with other signals.

Sometimes, the solution of increasing the gain is more difficult to realize. For example, a conflicting goal of portable systems is to maximize battery life by minimizing power consumption. Additionally, with the gains in device scaling that are being realized, supply voltages are decreasing thereby leaving less headroom to increase a gain level to improve a signal-to-noise ratio. Generally, decreasing the supply voltage and its associated power tends to decrease signal-to-noise ratios and the dynamic range of a signal or system operation.

More specifically some integrated circuit designs now utilize a supply voltage that is approximately equal to 3.3 volts. Prior integrated circuits, in contrast, utilized a supply that was equal to or greater than 5 volts. These particular trends are contrary to certain design goals such as goals to improve the performance of digital-to-analog converters. In the field of audio systems, signal-to-noise ratios and dynamic range of more than 100 decibels (dB) are often required to achieve the desired system performance. A digital-to-analog converter is used widely in the field of audio systems and is an essential circuit. The increasing miniaturization due to advancements in semiconductor processes continues to drive down supply voltage levels as well as the output range of an analog signal. Furthermore, the signal-to-noise ratios and dynamic range of the digital-to-analog converters will tend to decrease. Accordingly, there is a need to maintain or increase signal-to-noise ratios in the face of such trends.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
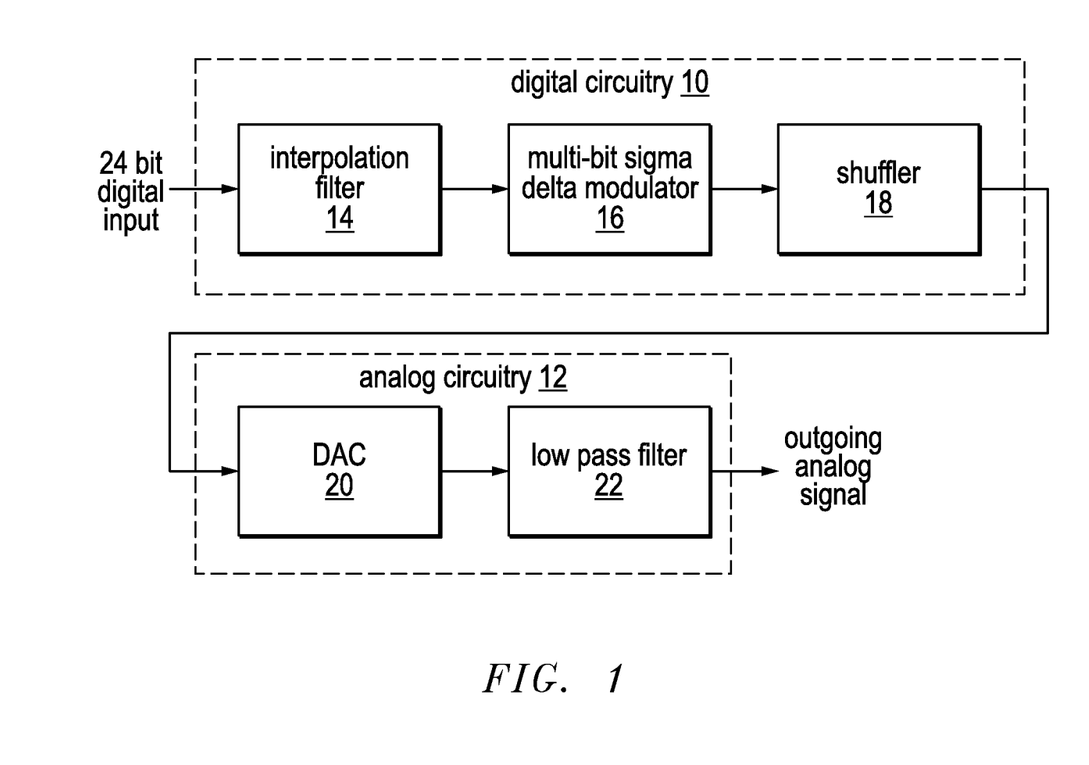
FIG. 1 is a block diagram of digital and analog circuitry that includes a Sigma-Delta digital-to-analog converter module according to one embodiment.

FIG. 1 is a block diagram of digital and analog circuitry that includes a Sigma-Delta digital-to-analog converter module according to one embodiment. The system of FIG. 1 is a mixed signal system that includes digital circuitry 10 that performs digital processing of a 24-bit digital input signal and produces a processed digital signal to analog circuitry 12 that converts the digital signal to an outgoing analog signal. More specifically, an interpolation filter 14 of digital circuitry 10 receives a 24-bit digital input in the described embodiment and performs interpolation filtering of the digital input. The output of interpolation filter 14 is produced to a multi-bit Sigma-Delta modulator 16 that digitally modulates the output of interpolation filter 14. The modulated output produced by Sigma-Delta modulator 16 is then shuffled by shuffler 18 which reduces the mismatch of the analog elements such as resistors and capacitors.

Analog circuitry 12 receives the digital signal produced by digital circuitry 10. More specifically, a digital-to-analog converter 20 produces an analog signal based on the received digital signal from digital circuitry 10. The analog signal produced by digital-to-analog converter 20 is produced to a low pass filter 22 that low pass filters the analog signal to produce an outgoing analog signal. The outgoing analog signal may then be processed by subsequent downstream analog processing circuitry according to the particular system.

In operation, the Sigma-Delta digital-to-analog converter utilizes noise shaping techniques and oversampling techniques to achieve high-performance digital-to-analog conversions. More specifically, the Sigma-Delta modulator performs noise shaping while modulating the signal. The analog circuitry utilizes discrete-time digital-to-analog converter circuitry to convert the digital signal to an analog form. For example, a multi-bit switched capacitor digital-to-analog converter and a low pass filter are used to produce an analog output signal with improved signal-to-noise ratios.

As will be described in greater detail below, the digital data produced by the Sigma-Delta modulator is converted to analog by a plurality of parallel-coupled digital-to-analog conversion processing modules without dividing the digital signal. This achieves higher signal-to-noise ratios and higher dynamic range from the digital-to-analog conversion stage. In essence, the signal component is amplified by a factor of N where N represents the number of parallel-coupled digital-to-analog conversion modules while the noise component is amplified by a factor equal to the square root of N. Accordingly, the signal-to-noise ratio is improved by a factor of N/(square root of N). To illustrate, if N=4, the signal-to-noise ratio is improved by a factor of 2 since 4/(square root of 4)=2.

Figure 2:
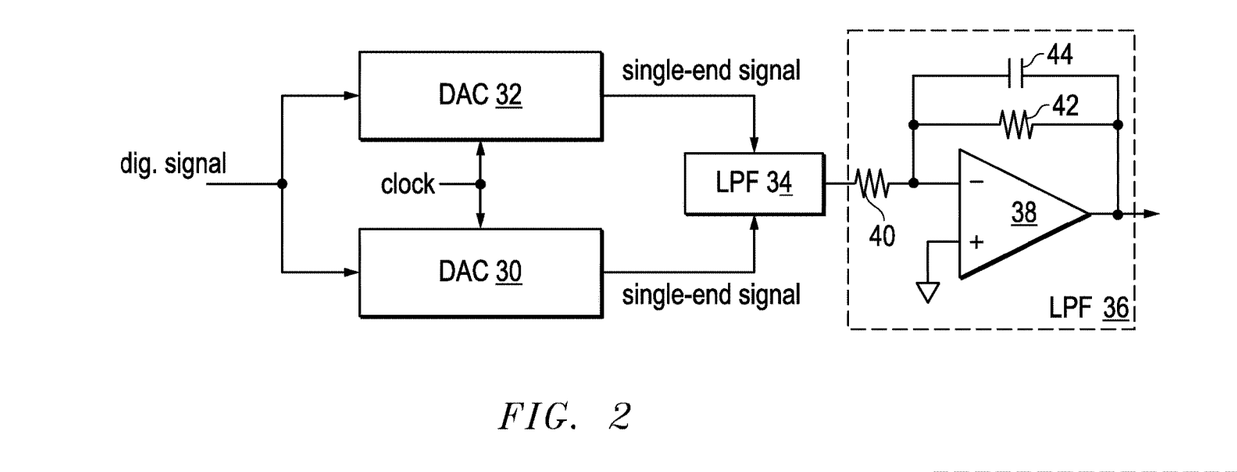
FIG. 2 is a partial block diagram and partial schematic diagram of a digital-to-analog converter system for single ended signals according to one embodiment.

FIG. 2 is a partial block diagram and partial schematic diagram of a digital-to-analog converter system for single ended signals according to one embodiment. More specifically, FIG. 2 illustrates the analog portion of the system that converts a digital signal to an analog signal according to one embodiment. Digital-to-analog converters 30 and 32 are connected to receive a digital signal. An output of digital-to-analog converter 30 is connected to an input of low pass filter 34. An output of digital-to-analog converter 32 also is connected to an input of low pass filter 34. The outputs of digital-to-analog converters 30 and 32 are single ended signals. Low pass filter 34 is configured to sum and low pass filter the received outputs of digital-to-analog converters 30 and 32 and to produces a low-pass filtered output to low pass filter 36. Low pass filter 36 comprises, in the described embodiment, an amplifier 38, a resistive element 40 connected to receive an input to the low pass filter and to an input (e.g., negative input) of amplifier 38, and a resistive element 42 connected in parallel to a capacitive element 44 in a feedback loop from the output and input of amplifier 38 (here the negative input). It should be understood that the single ended low pass filter embodiment of low pass filter 36 is but one embodiment and alternative designs for low pass filters may readily be used.

Figure 3:
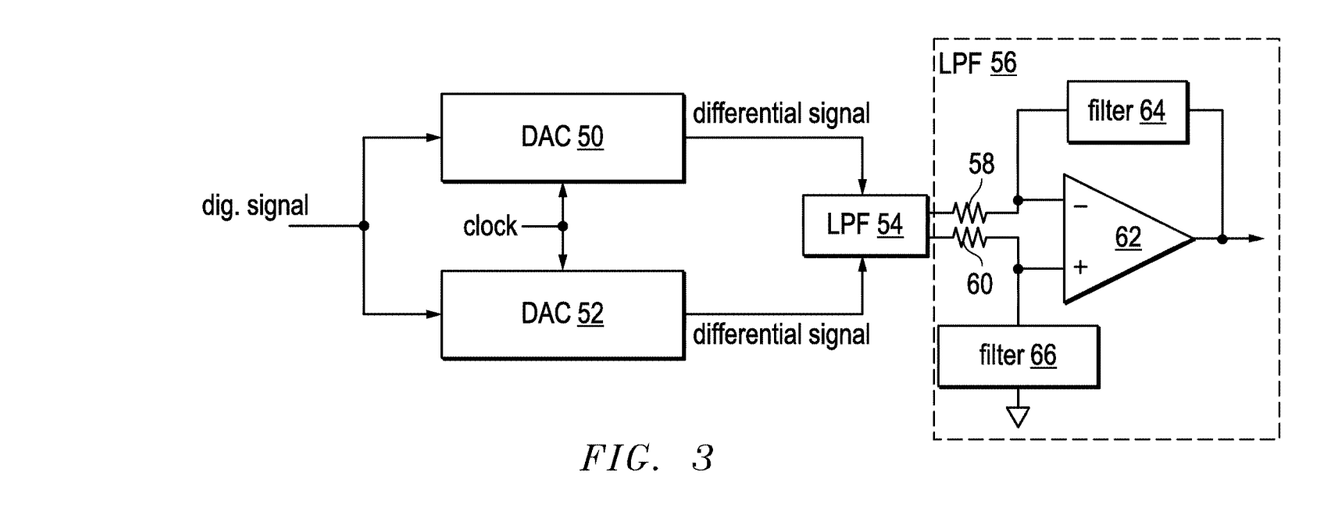
FIG. 3 is a partial block diagram and partial schematic diagram of a digital-to-analog converter system for differential signals according to one embodiment.

FIG. 3 is a partial block diagram and partial schematic diagram of a digital-to-analog converter system for differential signals according to one embodiment. An in-going digital signal is produced to a digital-to-analog converter 50 as well as to a digital-to-analog converter 52. Digital-to-analog converters 50 and 52 also receive a clock signal. Each of the digital-to-analog converters 50 and 52 convert the in-going digital signal to an analog signal and produce the analog signal to a low pass filter 54.

Low pass filter 54 sums the two analog signals received from digital-to-analog converters 50 and 52 and then low pass filters the summed analog signals to produce a differential low pass filtered analog signal to a low pass filter 56. Resistors 58 and 60 received the output of low pass filter 54 and conduct the received signal (a differential low pass filtered output of low pass filter 54) to the plus and minus inputs of an amplifier 62. A filter 64 is connected between an output of amplifier 62 and the minus input of amplifier 62 while a filter 66 is connected between the plus input of amplifier 62 and ground (or circuit common voltages). The combination of amplifier 62 and filters 64 and 66 and resistors 58 and 60 forms low pass filter 56. Low pass filter 56 provides additional low pass filtering to the output of low pass filter 54.

In operation, both digital-to-analog converters 50 and 52 convert the same received digital signal to an analog signal based on a clock (the same clock). Low pass filter 54, which receives the analog output signals produced by digital-to-analog converters 50 and 52, sums the two analog signals as well as low pass filtering them. This summing function is at least partly responsible for the gain increase according to one embodiment. As described before in relation to FIG. 1, this topology operates to increase a signal by a factor of N while increasing a noise signal by a factor of the square root of N.

Figure 4:
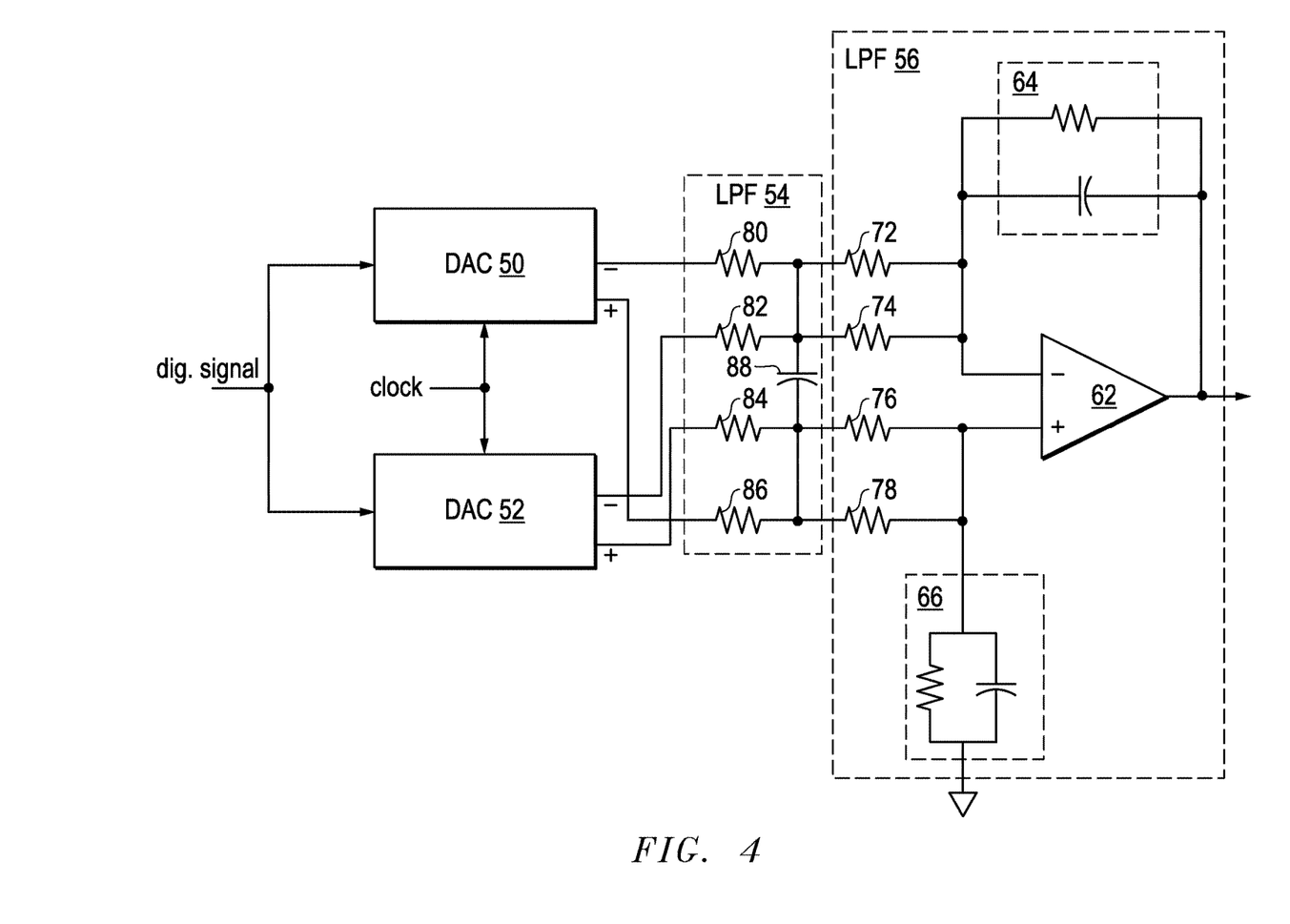
FIG. 4 is a partial block diagram and partial schematic diagram of a differential digital-to-analog converter system according to one embodiment.

FIG. 4 is a partial block diagram and partial schematic diagram of a differential digital-to-analog converter system shown partially in block form and partially in schematic form according to one embodiment. As may be seen in relation to FIG. 4, digital-to-analog converters 50 and 52 are connected as described before in relation to FIG. 3 to receive the digital signal and a clock signal. Digital-to-analog converter 50 includes a pair of outputs, mainly a differential output, whose signal components are produced to low pass filter 54. Similarly, digital-to-analog converter 52 includes a pair of outputs that produce differential output signal components to low pass filter 54.

The output of low pass filter 54 is produced to the input of amplifier 62 of low pass filter 56 via resistive elements 72, 74, 76 and 78 as shown. A filter 64 is connected across the minus input of amplifier 62 and the output of amplifier 62. A second filter 66 is connected between the plus input of amplifier 62 and ground (or circuit common voltages). Filters 64 and 66 also provide low pass filter functionality. As may be seen, each of the filters 64 and 66 comprise a resistive element in parallel to a capacitive element. In one embodiment, the filter response of filters 64 and 66 may be adjusted if either capacitor or resistor banks are used for the capacitive and resistive elements.

As may be further seen, low pass filter 54 and low pass filter jointly include four pairs of series connected resistors. A center node between each of the pairs of series connected resistors of low pass filters 54 and 56 is connected to a center node of another pair of series connected resistors and to a capacitive element. On an input side of the pairs of series connected resistors, each resistive element is connected to receive either a plus or minus component of a differential signal produced by either digital-to-analog converter 50 or digital-to-analog converter 52.

To be more specific, a minus component of the differential output of digital-to-analog converter 50 is produced to an input side of resistive element 80. An output side of resistive element 80 is connected to an input side of resistive element 72. A plus component of the differential output of digital-to-analog converter 50 is produced to an input side of resistive element 86. An output side of resistive element 86 is connected to an input side of resistive element 78. A minus component of the differential output of digital-to-analog converter 52 is produced to an input side of resistive element 82. An output side of resistive element 82 is connected to an input side of resistive element 74. A plus component of the differential output of digital-to-analog converter 52 is produced to an input side of resistive element 84. An output side of resistive element 84 is connected to an input side of resistive element 76. The output side of resistive elements 72 and 74 are connected to the minus input terminal of amplifier 62 while the output side of resistive elements 76 and 78 are connected to the plus input terminal of amplifier 62. The nodes connecting resistive elements 80 and 72 and resistive elements 82 and 74 are connected to one side of capacitive element 88. The nodes connecting resistive elements 84 and 76 and resistive elements 86 and 78 are connected to the other side of capacitive element 88. As may be seen, the combination of resistors 72, 74, 76 and 78, as well as filters 64 and 66 and amplifier 62 form a low pass filter 56 that provides additional differential low pass filtering of the differential output of low pass filter 54.

In operation, the configuration of low pass filter 54 as described above, serves to not only low pass filter the differential output of digital-to-analog converters 50 and 52, but also to sum or add those output signals. Low pass filter 54 then produces a summed and filtered differential output to the inputs of amplifier 62.

Figure 5:
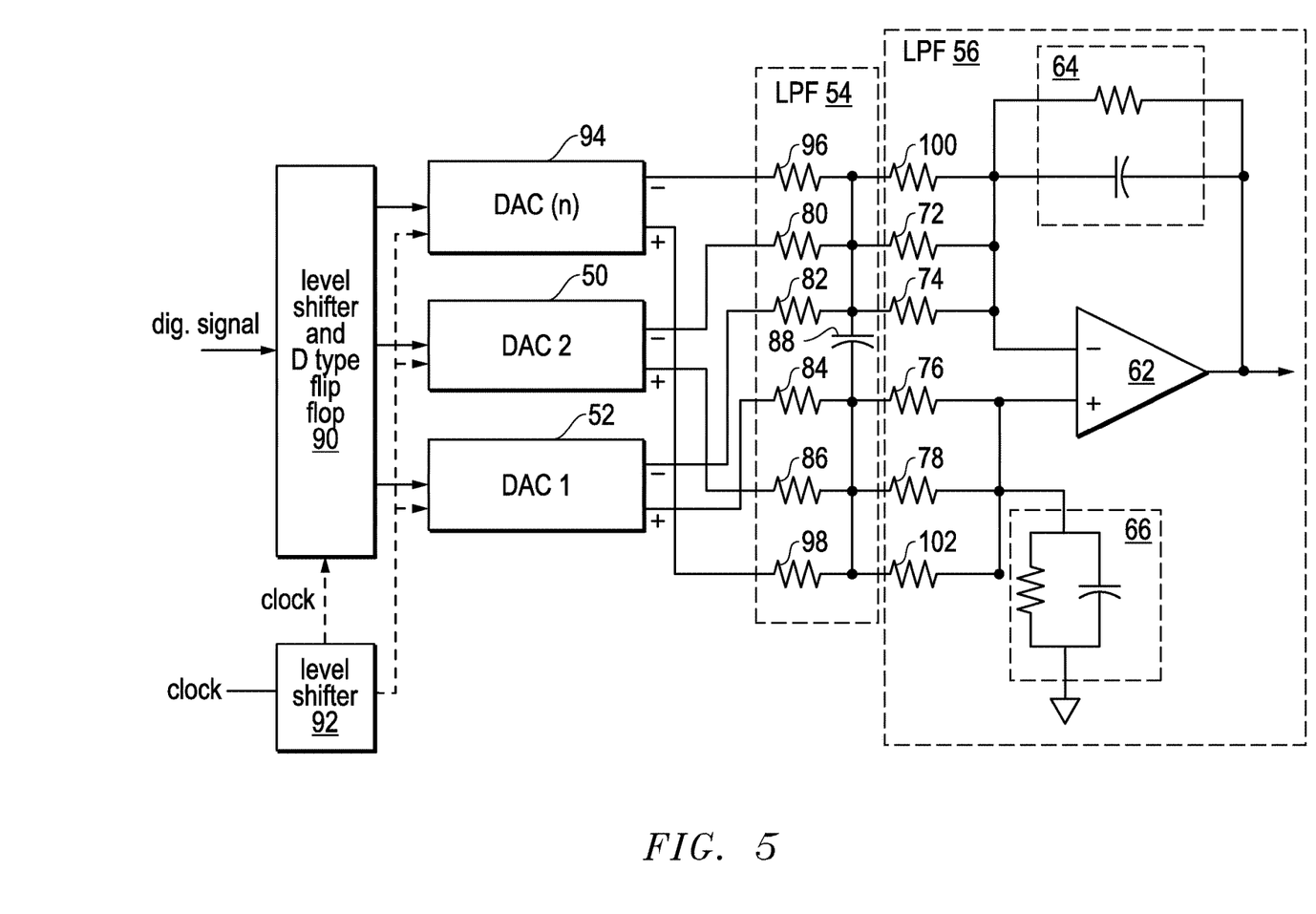
FIG. 5 is a partial block diagram and partial schematic diagram of a differential digital-to-analog converter system shown partially in block form and partially in schematic form according to an alternative embodiment of the invention that includes at least three parallel coupled digital-to-analog converter modules.

FIG. 5 is a partial block diagram and partial schematic diagram of a differential digital-to-analog converter system shown partially in block form and partially in schematic form according to an alternative embodiment of the invention that includes at least three parallel coupled digital-to-analog converter modules. As may be seen in relation to FIG. 5, the digital signal is received by a level shifter and D-type flip-flop 90. Level shifter and D-type flip-flop 90 translates the digital signal voltage level from a first level to a second level. In one embodiment, the first level is equal to 1.2 volts and the second level is equal to 3.3 volts. A level shifter 92 receives a clock at a first voltage level (e.g., 1.2 volts) and produces a clock at a second voltage level (e.g. 3.3 volts). Digital-to-analog converters 50 and 52 as described before in relation to FIGS. 3 and 4 as well as digital-to-analog converter 94 receive the digital signal at the second voltage level and a clock signal at the second voltage level.

Digital-to-analog converters (DACs) 50, 52 and 94 each includes a pair of outputs, namely a differential output, who signal components are produced to low pass filter 54. More specifically, the differential outputs of DAC 50 are produced to resistive elements 80 and 86. The differential outputs of DAC 52 are produced to resistive elements 82 and 84. The differential outputs of DAC 94 are produced to resistive elements 96 and 98. Resistive elements 96, 80, 82, 84, 86, and 98 along with capacitive element 88 that is connected as shown to these resistive elements form low pass filter 54. The output of low pass filter 54 is produced to low pass filter 56. Low pass filter 56 includes resistive elements 100, 72, 74, 76, 78 and 102. Resistive elements 100, 72, 74, 76, 78 and 102 are connected to resistive elements 96, 80, 82, 84, 86 and 98 along with capacitive element 88 as shown. Low pass filter 56 further includes filter 64 that is connected across the minus input of amplifier 62 and the output of amplifier 62. A second filter 66 is connected between the plus input of amplifier 62 and ground (or circuit common voltages). As may be seen, each of the filters 64 and 66 comprise a resistive element connected in parallel to a capacitive element. In one embodiment, the filter response of filters 64 and 66 may be adjusted if either capacitive banks or resistor banks are used for the capacitive and resistive elements. The combination of resistive elements 100, 72, 74, 76, 78 and 102, amplifier 62, and filters 64 and 66 form low pass filter 56. Low pass filter 56 provides additional low pass filtering to the output of low pass filter 54.

As may be further seen, low pass filter 54 and low pass filter 56 jointly form six pairs of series connected resistors. A center node between each of the pairs of series connected resistors is connected to a center node of two other pairs of series connected resistors and to a capacitive element. On an input side of the pairs of series connected resistors, each resistive element is connected to receive either a plus or minus component of a differential signal produced by either digital-to-analog converter 50, 52 or 94. More specifically, three pairs of series connected resistors receive the minus components of the three digital-to-analog converters 50, 52 and 94 while three pairs of series connected resistors receive the plus components of the three digital-to-analog converters 50, 52 and 94.

To be more specific, a minus component of the differential output of digital-to-analog converter 50 is produced to an input side of resistive element 80. An output side of resistive element 80 is connected to an input side of resistive element 72. A plus component of the differential output of digital-to-analog converter 50 is produced to an input side of resistive element 86. An output side of resistive element 86 is connected to an input side of resistive element 78. A minus component of the differential output of digital-to-analog converter 52 is produced to an input side of resistive element 82. An output side of resistive element 82 is connected to an input side of resistive element 74. A plus component of the differential output of digital-to-analog converter 52 is produced to an input side of resistive element 84. An output side of resistive element 84 is connected to an input side of resistive element 76. The output side of resistive elements 100, 72 and 74 are connected to the minus input terminal of amplifier 62 while the output side of resistive elements 102, 76 and 78 are connected to the plus input terminal of amplifier 62. The nodes connecting resistive elements 96 and 100, 80 and 72 and 82 and 74 are connected to one side of capacitive element 88. The nodes connecting resistive elements 98 and 102, 84 and 76 86 and 78 are connected to the other side of capacitive element 88. As may be seen, the combination of resistors 100, 102, 72, 74, 76 and 78, as well as filters 64 and 66 and amplifier 62 form a low pass filter 56 that provides additional differential low pass filtering of the differential output of low pass filter 54. While three digital-to-analog converters are shown, alternative embodiments may include additional digital-to-analog converters. Additional resistor pairs would also be included and configured similarly.

In operation, the configuration of low pass filter 54 as described above, serves to not only low pass filter the differential output of digital-to-analog converters 50, 52 and 94, but also to sum or add those output signals. Low pass filter 54 then produces a summed and filtered differential outputs to the inputs of amplifier 62. It should be understood by comparing FIGS. 4 and 5 that there are two resistor pairs for every digital-to-analog converter. For each digital-to-analog converter, one resistor pair receives a minus differential output component and one pair receives a plus different component. The center nodes of the resistor pairs that receive the minus differential output component are all connected to each and to one side of capacitor 88 while the center nodes of the resistor pairs that receive the plus differential output component are all connected to each and to other side of capacitor 88.

Figure 6:
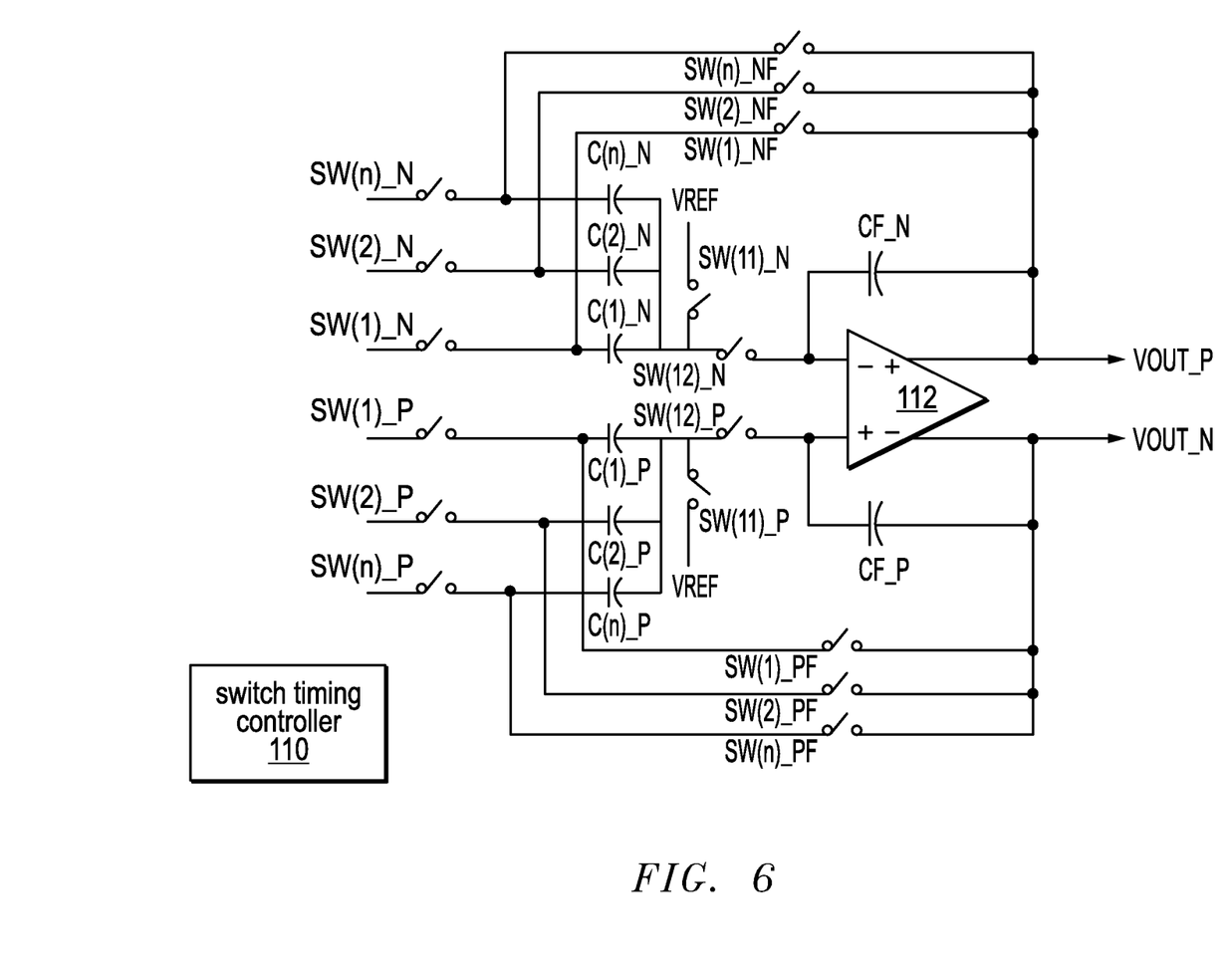
FIG. 6 is a partial block diagram and partial schematic diagram of a capacitive digital-to-analog converter according to one embodiment.

FIG. 6 is a partial block diagram and partial schematic diagram of a capacitive digital-to-analog converter according to one embodiment. As previously mentioned, the digital-to-analog converters are capacitive type converters that yield high performance with relative simple circuitry. To support such high performance oversampled processing, the configuration of the digital-to-analog converter includes a substantial number of switches and capacitive elements that are controlled by a switch timing controller 110. More specifically, six inputs are shown for the described embodiment. Each input is connected to a switch SW(1)_P to SW(n)_P for the three inputs that receive the plus digital components of the digital signal or to a switch SW(1)_P to SW(n)_P for the three inputs that receive the minus digital components of the digital signal.

The outputs of the switches are connected to C(1)_P to C(n)_P capacitive elements (for the plus signal components) and to C(1)_P to C(n)_P capacitive elements (for the minus signal components), respectively. The remaining ends of C(1)_P to C(n)_P capacitive elements are connected to the plus input of differential amplifier 112. The remaining ends of C(1)_N to C(n)_N capacitive elements are connected to the minus input of differential amplifier 112. Differential amplifier 112 produces a differential analog output at plus and minus output terminals that produce VOUT_P and VOUT_N.

Additionally, the plus output terminal of amplifier 112 is connected to one end of a feedback capacitor CF_N and the minus output terminal of amplifier 112 is connected to one end of a feedback capacitor CF_P. The other end of CF_N is connected to the minus input of amplifier 112 while the other end of CF_P is connected to the plus input of amplifier 112. Additionally, three feedback switches SW(1)_NF to SW(n)_NF are connected between the plus output terminal of amplifier 112 and to the output ends of switches SW(1)_N to SW(n)_N, respectively. Similarly, three feedback switches SW(1)_PF to SW(n)_PF are connected between the minus output terminal of amplifier 112 and to the output ends of switches SW(1)_P to SW(n)_P, respectively. Finally, reference voltages VREF are connected to the inputs of switches SW(12)_P and SW(12)_N via switches SW(11)_P and SW(11)_N, respectively. The outputs of switches SW(12)_P and SW(12)_N are connected to the plus and minus inputs of amplifier 112, respectively.

In operation, switch timing controller 110, based on an oversampled clock rate generates control signals not shown here (to keep the figures less complicated) to open and close the switches to oversample the digital data and charge and discharge the capacitive elements to generate an analog output signal based on the digital input signal. Switch timing controller 110 may be a discrete module or circuit or may be defined by logic executed by a processor.

Figure 7:
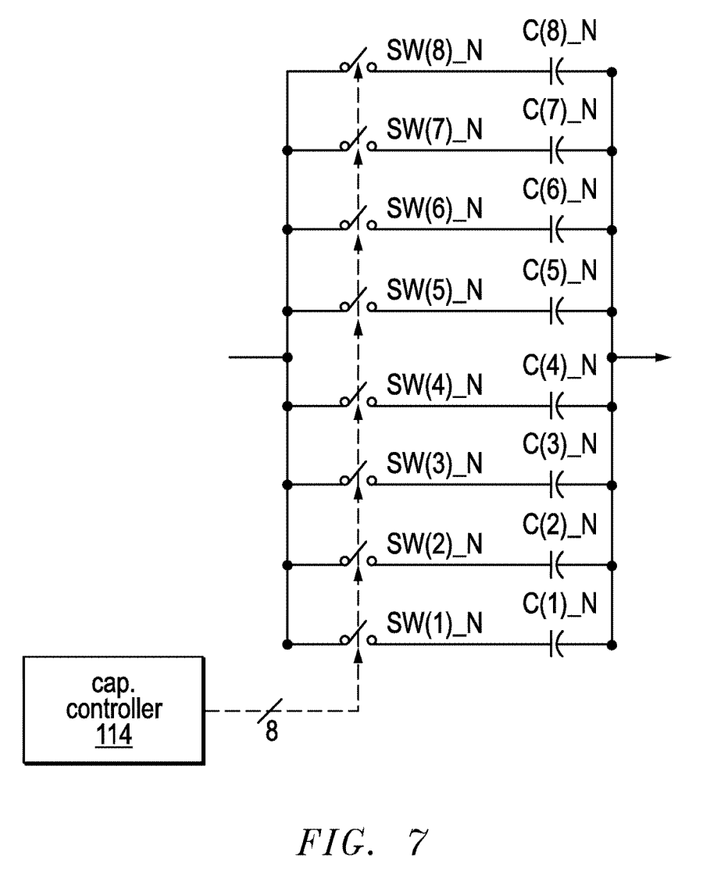
FIG. 7 is a partial block diagram and partial schematic diagram of a capacitor bank that may be used in place of the capacitive elements of the digital-to-analog converter to allow the circuitry to be adjusted during operations according to one embodiment.

FIG. 7 is a partial block diagram and partial schematic diagram of a capacitor bank that may be used in place of the capacitive elements of the digital-to-analog converter to allow the circuitry to be adjusted during operations according to one embodiment. It should be understood that a resistive bank might be similarly constructed and controlled to adjust resistance. One of average skill may account for the effects of connecting the devices in parallel to determine the appropriate capacitive or resistive values. Specifically, because capacitive elements in parallel may be summed to determine a total capacitance while resistive elements in parallel reduce the total resistance.

Any one or all of the capacitive elements C(1)_N to C(n)_N and C(1)_P to C(n)_P as well as CF_N and CF_P may be replaced by a capacitive bank similar to the one shown here in FIG. 7. Here, in the embodiment of FIG. 7, eight capacitive elements C(1) to C(8) are each connected in parallel with a selectable switch SW(1) to SW(8), respectively. A capacitance controller 114 is connected to deliver eight control signals to close or open the switches SW(1) to SW(8). Each of the capacitive elements is sized similarly. Alternatively, they may be sized in a stepped manner. Controller 114 selects which capacitive elements are to be connected to adjust the capacitance.

Figure 8:
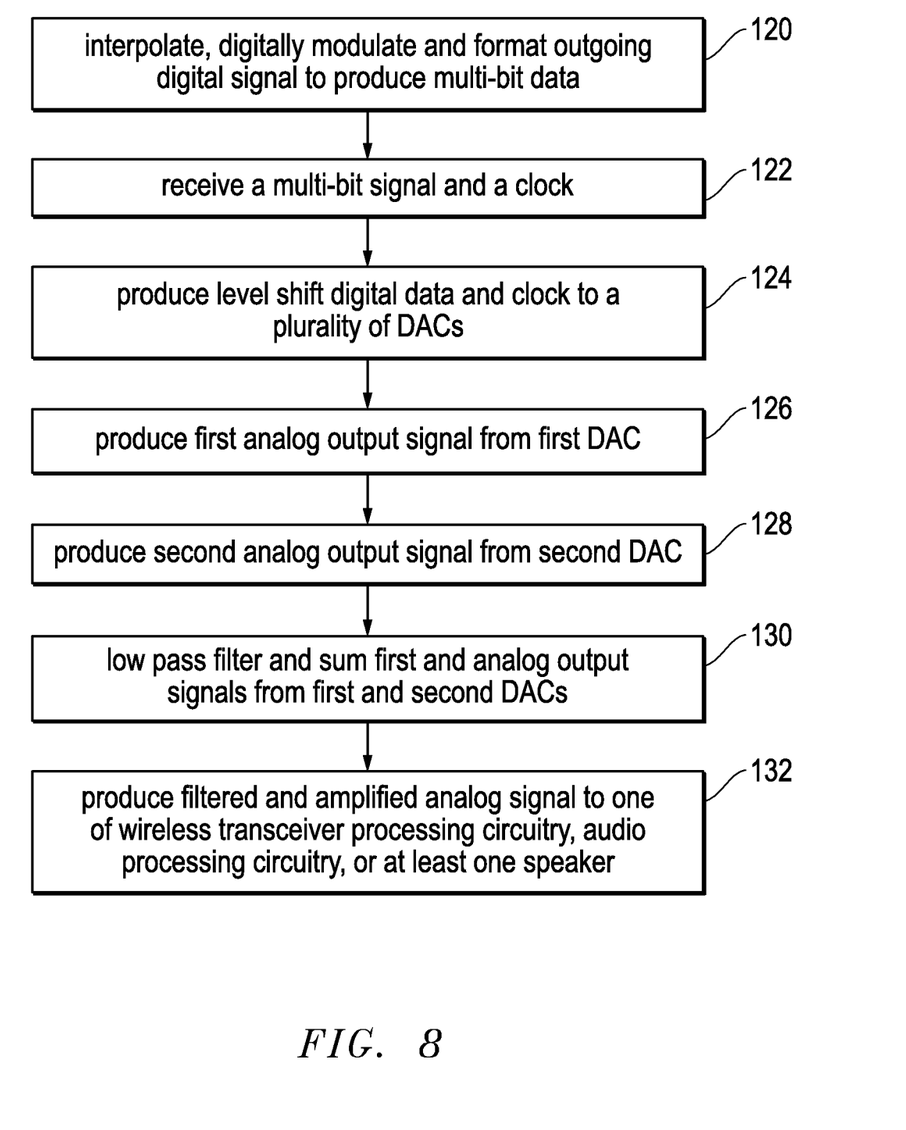
FIG. 8 is a flowchart that illustrates a method for converting a digital signal to an analog signal according to one embodiment.

FIG. 8 is a flowchart that illustrates a method for converting a digital signal to an analog signal according to one embodiment. Initially, a digital circuit will interpolate, digitally modulate and format outgoing digital signal to produce multi-bit data (120). An analog circuit will then receive the multi-bit signal and a clock (122) and will level shift digital data and clock and produce the level shifted data and clock to a plurality of DACs (124). A first DAC will produce a first analog output signal (126).

A second DAC will produce a second analog output signal (128) Thereafter, the method includes low pass filtering and sum first and analog output signals from first and second DACs (130) and producing filtered and amplified analog signal to one of wireless transceiver processing circuitry, audio processing circuitry, or at least one speaker (132).

Figure 9:
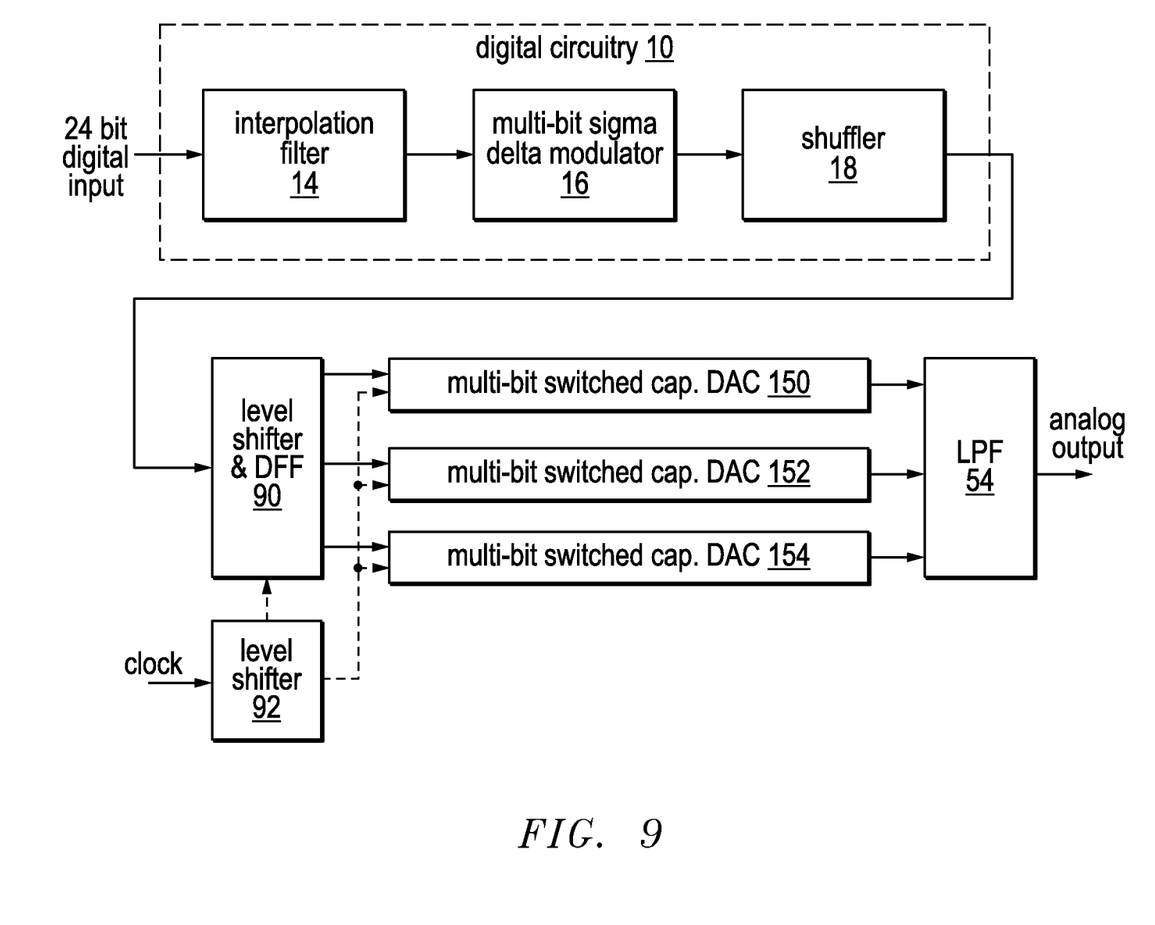
FIG. 9 is a functional block diagram of one embodiment that includes a plurality of multi-bit switched capacitor digital-to-analog converters.

FIG. 9 is a functional block diagram of one embodiment that includes a plurality of multi-bit switched capacitor digital to analog converters. Circuit elements that have been previously described will not be described here. As may be seen, digital circuitry 10 includes interpolation filter 14, modulator 16 and shuffler 18 as described previously. Additionally, a level shifter and D Flip Flops 90 and a level shifter 92 are configured to provide level shifted and clocked digital bit streams to a plurality of multi-bit switched capacitive DACs 150-154 as shown. Multi-bit switched capacitive DACs 150-154 may be configured as described before. The outputs of the multi-bit switched capacitive DACs 150-154 are then produced to low pass filter 54 that produces an analog output for further processing.

Signal to noise levels are improved in this embodiment because the signal level is improved by a factor of N while the noise increases at a rate of the square root of N as before. A single ended output reduces the number of output terminals and therefore external processing blocks that are required to process outgoing data.

Figure 10:
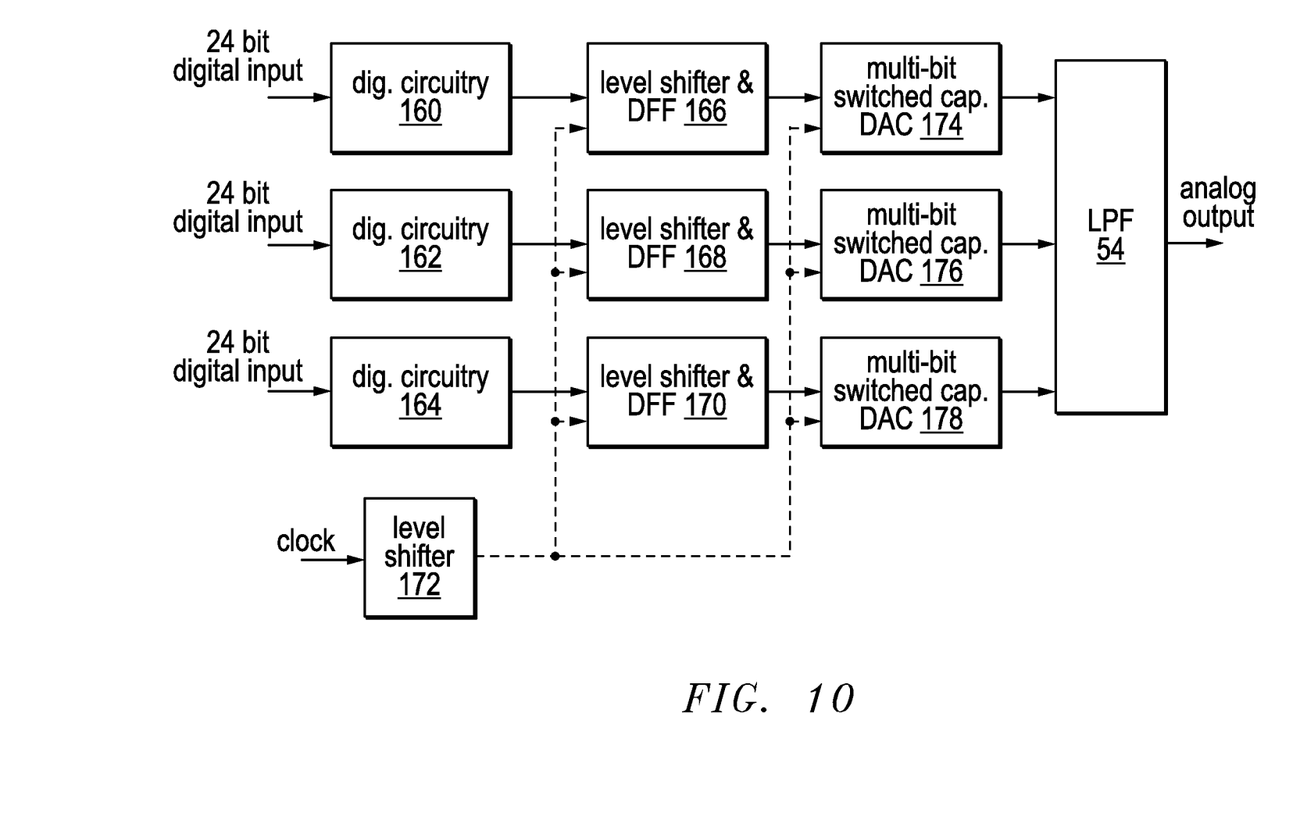
FIG. 10 is a functional block diagram of one alternative embodiment that includes a plurality of multi-bit switched capacitor digital-to-analog converters.

FIG. 10 is a functional block diagram of one alternative embodiment that includes a plurality of multi-bit switched capacitor digital to analog converters. Here, instead of utilizing one digital circuitry 10 as described previously, a plurality of digital circuitry blocks 160, 162 and 164 provide digital data streams to a corresponding plurality of level shifter blocks 166, 168, and 170, respectively, each having D Flip Flops. A level shifter 172 provides a level shifted clock to each of the level shifter blocks 166, 168, and 170 as well as the multi-bit switched capacitive DACs 174, 176 and 178.

Here, N units of digital processing blocks support receiving and processing multiple (e.g., differential) digital data streams. Thus, the input of different digital signal sources is also possible. This may, for example, support various mixing schemes.

Figure 11:
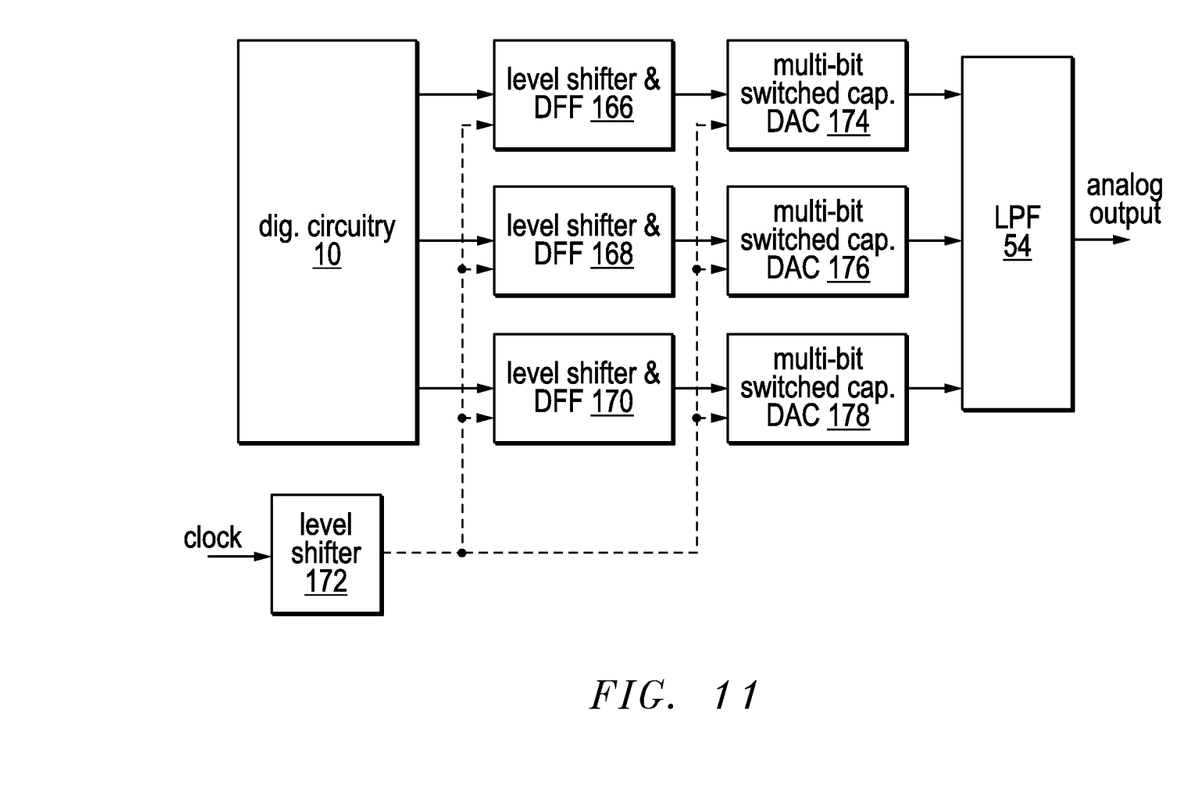
FIG. 11 is a functional block diagrams that illustrates an alternative embodiment that includes a plurality of multi-bit switched capacitive digital-to-analog converters.

FIG. 11 is a functional block diagrams that illustrates an alternative embodiment that includes a plurality of multi-bit switched capacitive digital-to-analog converters. Here, a digital circuitry 10 provides a plurality of bit streams to a corresponding plurality of level shifter blocks 166, 168 and 170, respectively, each having D Flip Flops. A level shifter 172 provides a level shifted clock to each of the level shifter blocks 166, 168 and 170 as well as the multi-bit switched capacitive DACs 174, 176 and 178.

Figure 12:
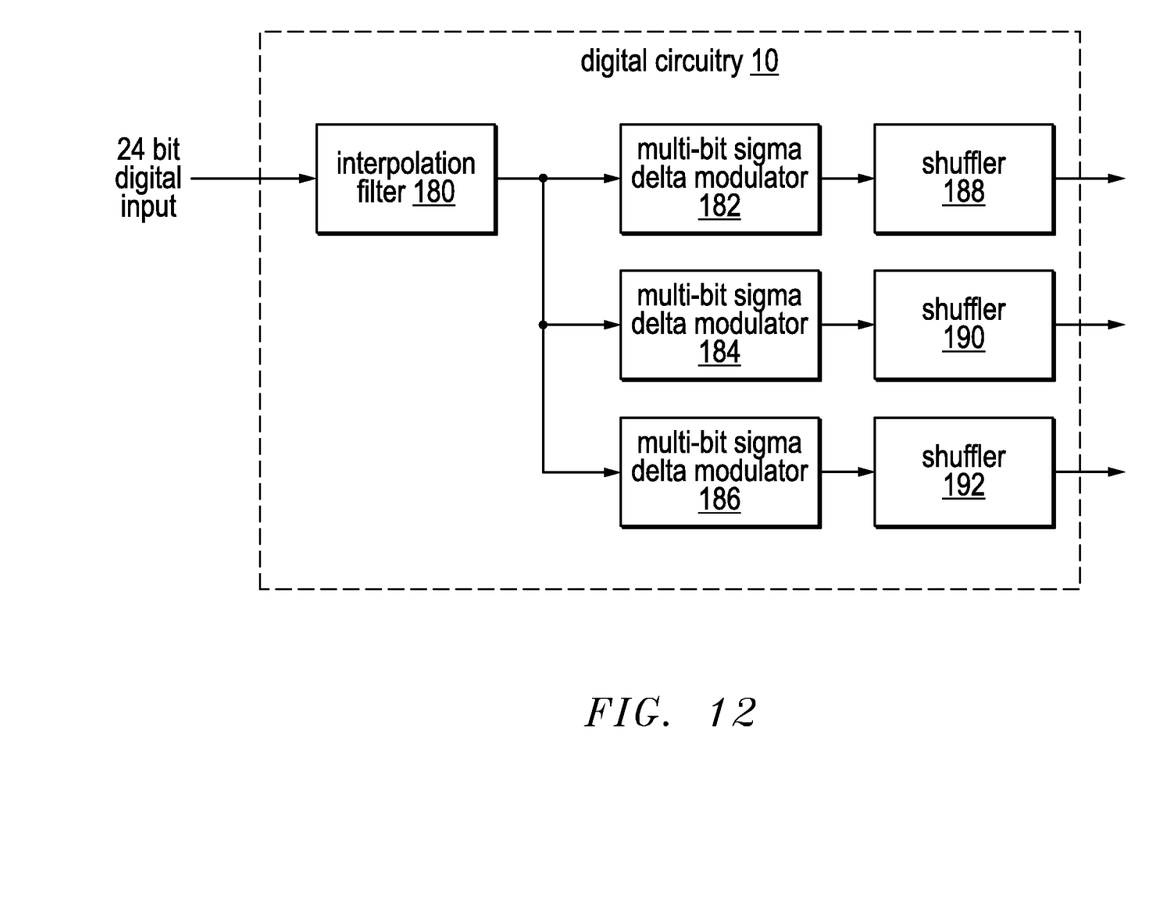
FIG. 12 is a functional block diagram of an alternative embodiment for the digital circuitry.

FIG. 12 is a functional block diagram of an alternative embodiment for the digital circuitry 10. As shown in FIG. 12, however, digital circuitry 10 includes one interpolation filter 180 but a plurality of multi-bit sigma delta modulators 182, 184 and 186 that produce modulated data to shufflers 188, 190 and 192. Shufflers 188, 190 and 192 produce the digital data streams to level shifter blocks 166, 168 and 170 of, for example, the level shifter blocks of FIG. 11.

The embodiment of FIGS. 11 and 12 allow for processing to reduce, for example, mismatch. Further, utilizing a modulator that introduces dither (any kind) reduces distortion, quantization noise, undesired correlation, etc. Thus, quantization noise is decreased. This further reduces low pass filtering requirements to allow simpler circuit designs.

The above-disclosed subject matter is to be considered illustrative, and not restrictive, and the appended claims are intended to cover all such modifications, enhancements, and other embodiments that fall within the true scope of the claims.

Additionally, the blocks and circuit elements may be implemented with various combinations of hardware and software, and the software component may be stored in a computer readable storage medium for execution by at least one processor. Moreover the method illustrated in FIG. 8 may also be governed by instructions that are stored in a computer readable storage medium and that are executed by at least one processor. Each of the operations shown in FIG. 8 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A digital-to-analog converter (DAC) circuit, comprising:
    a first DAC that receives a multi-bit digital signal and that produces a first analog output signal based upon the received multi-bit digital signal and upon a received clock;
    a second DAC that receives the multi-bit digital signal and that produces a second analog output signal based upon the received multi-bit digital signal and upon the received clock, wherein the first and second DACs are connected in parallel and receive the same multi-bit digital signal at respective inputs;
    a low pass filter connected to receive the first and second analog outputs and configured to sum the first and second analog outputs and to filter the summed first and second analog outputs to produce an ingoing analog signal; and
    an amplifier connected to receive the ingoing analog signal to produce an amplified ingoing analog signal,
    wherein the amplifier produces the amplified ingoing analog signal having a signal component that is amplified by a factor of N while a noise component is only amplified by a factor of the square root of N where N represents a number of parallel connected DACs.

2. The DAC circuit of claim 1 wherein the first and second DACs each produce differential first and second analog output signals, respectively.

3. The DAC circuit of claim 2 wherein the low pass filter is configured to receive the differential first and second analog output signals and sum and filter the differential first and second analog output signals to produce a differential ingoing analog signal.

4. The DAC circuit of claim 3 wherein the amplifier receives the differential ingoing analog signal at plus and minus input terminals and produces an amplified ingoing analog signal that is single ended at an amplifier output.

5. The DAC circuit of claim 1 wherein a first RC filter comprising parallel coupled resistive and capacitive elements is connected across a first input terminal of the amplifier and to an amplifier output to create a filtered feedback path.

6. The DAC circuit of claim 1 wherein a second input terminal of the amplifier is connected to a first common node of a second RC filter comprising parallel coupled resistive and capacitive elements and wherein a second node of the second RC filter is connected to one of ground or circuit common.

7. The DAC circuit of claim 1 wherein each of the first and second DACs comprises multi-bit switched capacitor type DACs having "n" inputs connected to receive the multi-bit digital signal in parallel and wherein the received clock drives the first and second DACs to convert the received multi-bit digital signal to analog signals.

8. The DAC circuit of claim 7 wherein each of the "n" inputs of first and second DACs is connected to a one of a capacitor or a capacitor bank.

9. The DAC circuit of claim 1 wherein:
    a first plurality of capacitor banks are connected to receive and process the "plus" side of a differential multi-bit digital data;
    each capacitor bank of the first plurality of capacitor banks has a commonly connected output node that is further connected to a first input terminal of a DAC amplifier;
    a second plurality of capacitor banks are connected to receive and process the "minus" side of the differential multi-bit digital data; and
    each capacitor bank of the second plurality of capacitor banks has a commonly connected output node that is further connected to a second input terminal of the DAC amplifier.

10. The DAC circuit of claim 1 further comprising at least three parallel connected DACs that produce analog output signals based upon the received multi-bit digital signal and upon the received clock.

11. A signal processing system, comprising:
    a data source that generates an outgoing digital signal;
    a digital processing circuit configured to interpolate, modulate and produce digital data that is formatted based on the outgoing digital signal;
    a signal conversion block comprising a plurality of parallel connected digital-to-analog converters (DACs) configured to convert the digital signal to produce an outgoing analog signal having a signal-to-noise ratio that is amplified by a ratio that is equal to or greater than N/(square root of N) where N represents a number of parallel connected DACs, wherein the signal conversion block comprises:
- a first DAC that produces a first analog output signal based upon a received multi-bit digital signal and upon a received clock;
- a second DAC that produces a second analog output signal based upon the received multi-bit digital signal and upon the received clock, wherein the first and second DACs are connected in parallel and process the same multi-bit digital signal;
- a low pass filter connected to receive the first and second analog outputs and configured to sum the first and second analog outputs and to filter the summed first and second analog outputs to produce an ingoing analog signal; and
- an amplifier connected to receive the ingoing analog signal to produce an amplified ingoing analog signal; and
- an analog processing circuit that processes the analog signal.

12. The signal processing system of claim 11 wherein the analog processing circuit comprises at least one of an analog front end of a radio and an audio processing circuit for producing an audio signal for being converted to sound by at least one speaker.

13. The signal processing system of claim 11 wherein the signal conversion block further comprises:
- a third DAC that produces a third analog output signal based upon the received multi-bit digital signal and upon the received clock, wherein the first, second and third DACs are connected in parallel and process the same multi-bit digital signal;
- wherein the low pass filter is further connected to receive the first, second and third analog outputs and configured to sum the first, second and third analog outputs and to filter the summed first, second and third analog outputs to produce the ingoing analog signal.

14. A method for processing a signal, comprising:
receiving a multi-bit digital signal and a clock;
producing a first analog output signal from a first digital-to-analog converter (DAC) based upon the multi-bit digital signal and the clock;
producing a second analog output signal from a second DAC based upon the multi-bit digital signal and the clock; and
low pass filtering and summing the first and second analog output signals with a combined summing and lowpass filtering circuit and producing an amplified outgoing analog signal having a signal-to-noise ratio that is amplified by a ratio that is equal to or greater than N/(square root of N) where N represents a number of parallel connected DACs.

15. The method of claim 14 further including interpolating, modulating, formatting and producing the multi-bit digital signal based on an outgoing digital signal prior to producing the first or second analog output signals.

16. The method of claim 14 further including processing and wirelessly transmitting the outgoing analog signal by an analog front end of a radio.

17. The method of claim 14 further including audio processing the outgoing analog signal by audio processing circuitry and producing an audio signal at least one speaker.

18. The method of claim 14 wherein producing the first and second analog output signals includes converting the multi-bit digital signal in one or more capacitive type DACs.

19. The DAC circuit of claim 3 wherein the low pass filter comprises:
- a first resistor having a first terminal for receiving a negative component of the first analog signal, and a second terminal for forming a negative component of the differential ingoing analog signal;
- a second resistor having a first terminal for receiving the negative component of the second analog signal, and a second terminal coupled to the second terminal of the first resistor;
- a third resistor having a first terminal for receiving a positive component of the first analog signal, and a second terminal for forming a positive component of the differential ingoing analog signal;
- a fourth resistor having a first terminal for receiving the positive component of the second analog signal, and a second terminal coupled to the second terminal of the third resistor; and
- a capacitor having a first terminal coupled to the second terminals of the first and second resistors, and a second terminal coupled to the second terminals of the second and fourth resistors.

* * * * *